(12) United States Patent
Choi et al.

(10) Patent No.: US 8,921,993 B2
(45) Date of Patent: Dec. 30, 2014

(54) SEMICONDUCTOR PACKAGE HAVING EMI SHIELDING FUNCTION AND HEAT DISSIPATION FUNCTION

(71) Applicant: Samsung Electronics Co., Ltd, Suwon-si, Gyeonggi-do (KR)

(72) Inventors: In-Ho Choi, Seoul (KR); Yong-Hoon Kim, Suwon-si (KR); Seong-Ho Shin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/153,327

(22) Filed: Jan. 13, 2014

(65) Prior Publication Data

US 2014/0328023 A1 Nov. 6, 2014

(30) Foreign Application Priority Data

May 2, 2013 (KR) ........................ 10-2013-0049495

(51) Int. Cl.
*H01L 23/52* (2006.01)
*H01L 23/552* (2006.01)

(52) U.S. Cl.
CPC .................................. *H01L 23/552* (2013.01)
USPC ............................ 257/691; 257/707; 257/704

(58) Field of Classification Search
USPC .......................... 257/691, 704, 706, 707, 786
See application file for complete search history.

(56) References Cited

U.S. PATENT DOCUMENTS

| 6,442,045 | B1 | 8/2002 | Goodwin et al. |
| 7,254,032 | B1 | 8/2007 | Xue et al. |
| 8,089,131 | B2 * | 1/2012 | Yamazaki ..................... 257/415 |
| 8,138,876 | B2 * | 3/2012 | Ding et al. ..................... 336/200 |
| 2002/0180001 | A1 * | 12/2002 | Woo et al. ..................... 257/546 |
| 2006/0219427 | A1 * | 10/2006 | Haridass et al. .............. 174/255 |
| 2010/0244102 | A1 * | 9/2010 | Kusumoto .................... 257/207 |
| 2012/0119346 | A1 | 5/2012 | Im et al. |

FOREIGN PATENT DOCUMENTS

| JP | 2001-250915 | 9/2001 |
| KR | 10-0706516 | 8/2002 |
| KR | 2003-0041653 | 5/2003 |
| KR | 2006-0088390 | 8/2006 |
| KR | 10-0848193 | 5/2008 |
| KR | 2008-0078486 | 8/2008 |
| KR | 2008-0113637 | 12/2008 |
| KR | 10-0895816 | 3/2009 |
| KR | 10-0973053 | 7/2010 |
| KR | 10-1101568 | 5/2011 |

* cited by examiner

*Primary Examiner* — Sheila V. Clark
(74) *Attorney, Agent, or Firm* — Ellsworth IP Group PLLC (57) ABSTRACT

A semiconductor package includes a substrate, a semiconductor chip located on a top surface of the substrate, signal lines formed on the top surface of the substrate and configured to allow different types of signals to input/output thereto/therefrom, a ground line unit formed on the top surface of the substrate and configured to divide the signal lines into signal lines to/from which the same types of signals are input/output to be isolated from one another, barrier walls configured to contact the ground line unit, and a heat dissipation unit disposed on the semiconductor chip, wherein the ground line unit includes diagonal ground lines located in diagonal directions of the substrate about the semiconductor chip, and the heat dissipation unit includes a thermal interface material (TIM) located on a top surface of the semiconductor chip, and a heat dissipation plate configured to cover the TIM and the substrate.

20 Claims, 12 Drawing Sheets

SEMICONDUCTOR PACKAGE HAVING EMI SHIELDING FUNCTION AND HEAT DISSIPATION FUNCTION

CROSS-REFERENCE TO RELATED APPLICATIONS

This application claims the benefit of priority under 35 U.S.C. §119 to Korean Patent Application No. 10-2013-0049495 filed on May 2, 2013, the disclosure of which is hereby incorporated by reference in its entirety.

BACKGROUND

1. Field

Embodiments of the present general inventive concept relate to a semiconductor package that may shield electromagnetic interference (EMI) generated due to interference between different types of signals, and may discharge heat generated therein.

2. Description of the Related Art

Lately, for mobile products, a multifunctional chip is required not only to have a thin design with a uniform thickness but also to integrate functional chips into one chip in order to minimize areas occupied by the functional chips.

Electromagnetic interference (EMI) is generated due to interference between different types of signals in a semiconductor package including such multi-functional semiconductor chips. High heat is also generated, thereby leading to a malfunction of a device.

Accordingly, various semiconductor packages having both an EMI shielding function and a heat dissipation function are herein provided.

SUMMARY

Embodiments of the present general inventive concept provide a semiconductor package in which electromagnetic interference (EMI) due to interference between different types of signals is prevented.

Embodiments of the present general inventive concept also provide a semiconductor package including a heat dissipation unit having high thermal conductivity.

Detailed embodiments of the present general inventive concept provide a semiconductor package including a barrier wall formed between different types of signal lines, and a ground line contacting the barrier wall, in order to shield signal interference between the different types of signals and achieve effective grounding.

Detailed embodiments of the present general inventive concept also provide a semiconductor package including a thermal interface material (TIM) and a heat dissipation plate as the heat dissipation unit.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a semiconductor package including a substrate, a semiconductor chip located on a top surface of the substrate, signal lines formed on the top surface of the substrate and configured to allow different types of signals to input/output thereto/therefrom, a ground line unit formed on the top surface of the substrate and configured to divide the signal lines into signal lines to/from which the same types of signals are input/output to be isolated from one another, barrier walls configured to contact the ground line unit, and a heat dissipation unit disposed on the semiconductor chip, wherein the ground line unit includes diagonal ground lines located in diagonal directions of the substrate about the semiconductor chip, and the heat dissipation unit includes a thermal interface material (TIM) located on a top surface of the semiconductor chip, and a heat dissipation plate configured to cover the TIM and the substrate.

The ground line unit may further include a ground perimeter formed along a circumference of the top surface of the substrate and configured to connect to one end of each of the diagonal ground lines, respectively.

The semiconductor package may further comprise an adhesive formed along a circumference of the top surface of the substrate and configured to attach the substrate and the heat dissipation plate.

The barrier walls and the diagonal ground lines may be equal in number and may be formed on the same positions.

The heat dissipation plate may be integrally formed with the barrier walls.

The semiconductor package may further include upper lands and chip bumps stacked between the substrate and the semiconductor chip, wherein at least one of the diagonal ground lines is electrically connected to the upper lands.

The semiconductor package may further include a ground plate formed in the substrate to have a plate shape and configured to be electrically connected to the ground line unit.

The ground line unit may further include vertical ground lines formed to be perpendicular to at least one side of the substrate.

The semiconductor package may further include a ground perimeter formed along a circumference of the top surface of the substrate and configured to be connected to respective one ends of each of the diagonal ground lines and the vertical ground lines.

The barrier walls may be equal in number to and formed on the same positions as the diagonal ground lines and the vertical ground lines.

The foregoing and/or other features and utilities of the present general inventive concept may also be achieved by providing a semiconductor package including a substrate, a semiconductor chip located on a top surface of the substrate, signal lines formed on the top surface of the substrate and configured to allow different types of signals to be input/output thereto/therefrom, a ground line unit formed on the top surface of the substrate and configured to divide the signal lines into signal lines to/from which the same types of signals are input/output to be isolated from one another, barrier walls configured to contact the ground line unit, and a heat dissipation unit disposed on the semiconductor chip, wherein the ground line unit includes diagonal ground lines located in diagonal directions of the substrate about the semiconductor chip, bent ground lines bent from one ends of the diagonal ground lines, and vertical ground lines located to be perpendicular to at least one side of the substrate, and the heat dissipation unit includes a thermal interface material (TIM) located on a top surface of the semiconductor chip, and a heat dissipation plate configured to cover the TIM and the substrate.

The bent ground lines may be formed to have two members connected at an angle, each member positioned parallel to and spaced apart from one side of the substrate and connected to the top surface of the substrate.

The semiconductor package may further include upper lands and chip bumps stacked between the substrate and the semiconductor chip, wherein the vertical ground lines are electrically connected to the upper lands.

The foregoing and/or other features and utilities of the present general inventive concept may also be achieved by providing an electronic system, including a power supply configured to supply power to components of the electronic system, and a microprocessor including a semiconductor package, comprising a substrate, a semiconductor chip mounted on the substrate, signal lines formed on a surface of the substrate and configured to transmit different types of signals, respectively, a ground line unit formed to isolate the signal lines into groups of lines through which same types of signals are transmitted, barrier walls formed in contact with the ground line unit between the groups of lines, and a heat dissipation unit formed in contact with the semiconductor chip.

The electronic system may further comprise an interface to communicate with an external device according to a wired or wireless communication method to transmit data of the semiconductor chip to the external device or receive data from the external device.

The ground line unit may be formed to partially enclose each of the groups of lines, individually.

The ground line unit may be formed to completely enclose each of the groups of lines, individually.

The barrier walls may be positioned congruously with the ground line unit.

The heat dissipation unit may comprise a heat dissipation plate attached to the substrate and covering the semiconductor chip, and a TIM formed between the heat dissipation plate and the semiconductor chip to attach the heat dissipation plate to the semiconductor chip.

The heat dissipation plate may be integrally formed with the barrier walls.

The heat dissipation plate and the barrier walls may comprise a metal material of copper, aluminum or an alloy.

The semiconductor chip may perform a memory function, image processing function, or a voice processing function.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE EMBODIMENTS

The features and objectives of the present general inventive concept will become more apparent through the following embodiments and drawings. The embodiments are provided so that this disclosure will be thorough and complete and will fully convey the scope of the inventive concept to one of ordinary skill in the art. Accordingly, the present general inventive concept may be embodied in many different forms and should not be construed as limited to the exemplary embodiments set forth herein. In the drawings, shapes and sizes of layers and regions are intended to assist the understanding of the inventive concept and may be exaggerated for convenience. Thus, the regions illustrated in the figures are schematic in nature and their shapes are not intended to illustrate the actual shapes of regions and are not intended to limit the scope of the present general inventive concept. The same reference numerals used herein denote the same elements.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

Figure 1A:
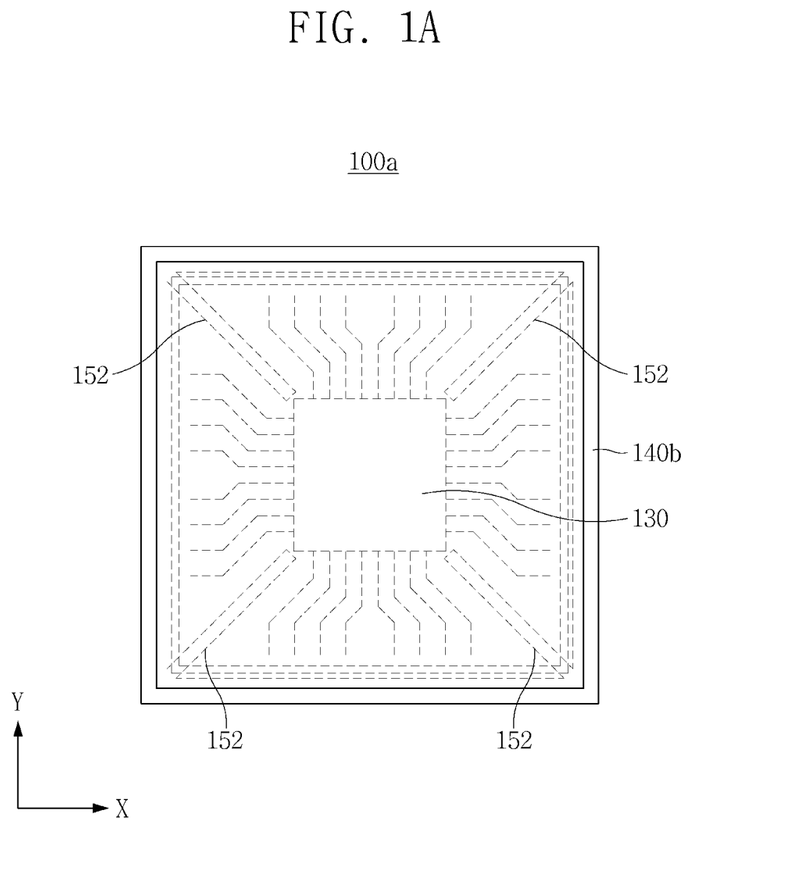
FIG. 1A is a top plan view illustrating a semiconductor package in accordance with an exemplary embodiment of the present general inventive concept.
Figure 1B:
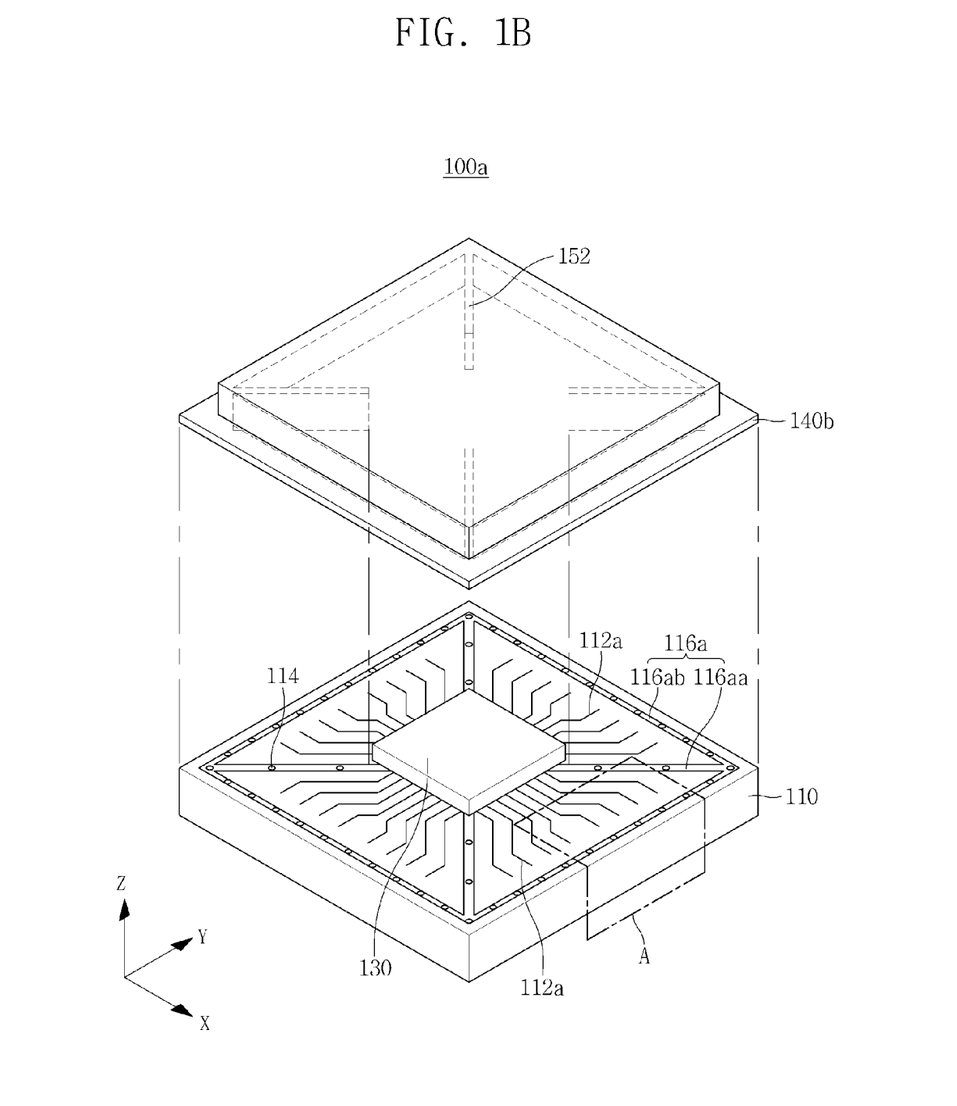
FIG. 1B is an exploded perspective view illustrating the semiconductor package of FIG. 1A.
Figure 1C:
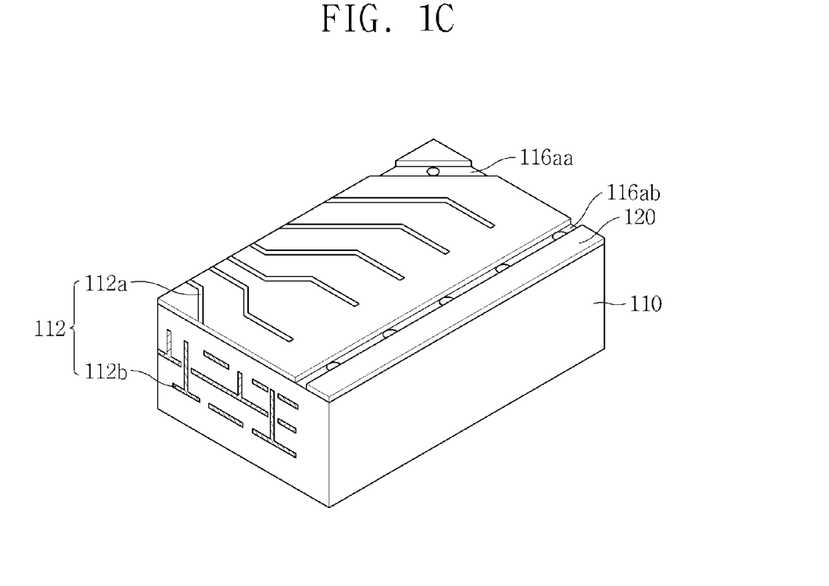
FIG. 1C is an enlarged view illustrating portion A of FIG. 1B.
Figure 1D:
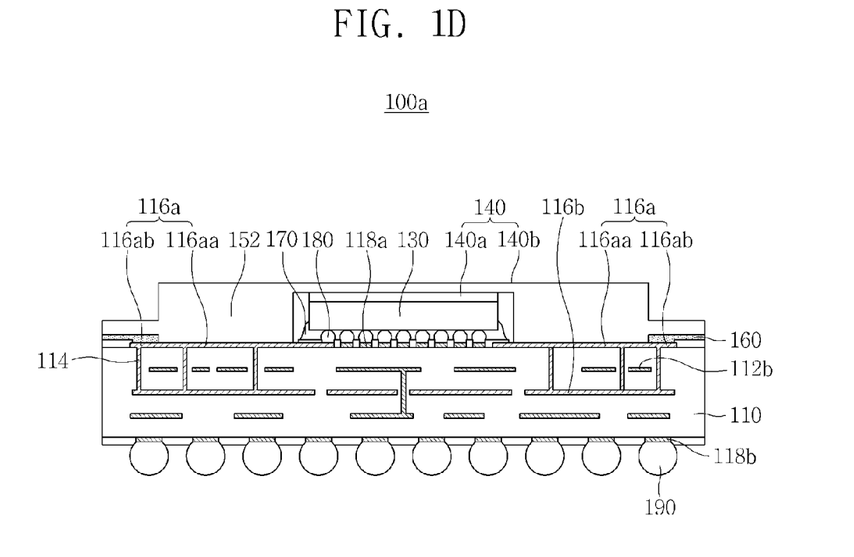
FIG. 1D is a side cross-sectional view taken in a diagonal direction of FIG. 1A.

FIG. 1A is a top plan view illustrating a semiconductor package 100a in accordance with an embodiment of the present general inventive concept. FIG. 1B is an exploded perspective view illustrating the semiconductor package 100a of FIG. 1A. FIG. 1C is an enlarged view illustrating portion A of FIG. 1B. FIG. 1D is a side cross-sectional view taken in a diagonal direction of FIG. 1A.

Referring to FIGS. 1A, 1B, 1C, and 1D, the semiconductor package 100a may include a substrate 110, a semiconductor chip 130, barrier walls 152, and a heat dissipation unit 140. The semiconductor package 100a may further include chip bumps 180 that connect the semiconductor chip 130 and the substrate 110, solder balls 190 that are attached to a bottom surface of the substrate 110, an underfill material 170 that is located under the semiconductor chip 130 and surrounds the chip bumps 180, and an adhesive 160 that is formed along a circumference of the top surface of the substrate 110.

The substrate 110 may include a signal line unit 112, via-holes 114, a ground line unit 116a, a ground plate 116b, upper lands 118a that contact a top surface of the substrate 110 and the chip bumps 180, and lower lands 118b that contact the bottom surface of the substrate 110 and the solder balls 190.

The substrate 110 may include a rigid printed circuit board (PCB), a flexible PCB, or a rigid-flexible PCB.

The signal line unit 112 may include surface signal lines 112a that are formed on a surface of the substrate 110, and internal signal lines 112b that are formed as multi-layers in the substrate 110. According to various functions of the semiconductor chip 130, different types of main signals may be input to or output from the surface signal lines 112a, and auxiliary signals may be input to or output from the internal signal lines 112b. The surface signal lines 112a and the internal signal lines 112b may be electrically connected to interfaces of a system substrate through the via-holes 114 and the solder balls 190. The interfaces of the system substrate may be, for example, double data rate (DDR) interfaces, high definition multimedia interfaces (HDMI), serial advanced technology attachment (SATA) interfaces, or universal serial bus (USB) interfaces. The interfaces may be configured to communicate with an external device according to a wired or wireless communication method to transmit data of the semiconductor chip 130 to the external device or receive data from the external device. The system substrate may be a PCB substrate on which the semiconductor package 100a is mounted.

Referring to FIG. 1C, the substrate 110 may further include a coating layer 120 that covers the surface signal lines 112a. The coating layer 120 may include a solder resist.

The semiconductor chip 130 may include an integrated semiconductor chip 130 that performs a memory function, an image processing function, a voice processing function, etc.

The ground line unit 116a may be formed such that signal lines formed in a radial fashion about the semiconductor chip 130 are grouped into lines through which the same types of signals flow to be isolated from one another. For example, the ground line unit 116a may include diagonal ground lines 116aa that are formed between lines through which different types of signals flow from among the surface signal lines 112a, and a ground perimeter 116ab that contacts the diagonal ground lines 116aa and is formed along a circumference of the top surface of the substrate 110. The diagonal ground lines 116aa may be located in first and second diagonal directions of the substrate 110 about the semiconductor chip 130.

The ground line unit 116a may open and expose the coating layer 120. Referring to FIG. 1D, at least one of the diagonal ground lines 116aa may be electrically connected to the upper lands 118a.

The ground plate 116b may be formed in the substrate 110 to have a plate shape, and may be electrically connected to the ground line unit 116a through the via-holes 114 formed in the surface of the substrate 110.

The barrier walls 152 may contact the diagonal ground lines 116aa. The same number of barrier walls 152 and diagonal ground lines 116aa may be formed on the same positions.

The barrier walls 152 may be located between different types of signal lines, and may shield interference between the different types of signals.

The heat dissipation unit 140 may include a thermal interface material (TIM) 140a and a heat dissipation plate 140b.

The TIM 140a may be formed between the semiconductor chip 130 and the heat dissipation plate 140b. The TIM 140a may include thermal grease, a thermal sheet/film, a thermal PAD, and the adhesive 160 that is a thermal adhesive. The TIM 140a may include a filler having high thermal conductivity, for example, aluminum oxide ($Al_2O_3$), silver, silicon dioxide ($SiO_2$), aluminum nitride (AlN), or boron nitride.

The heat dissipation plate 140b may cover the semiconductor chip 130, the barrier walls 152, and the substrate 110. The heat dissipation plate 140b may be integrally formed with the barrier walls 152. The heat dissipation plate 140b may have a structure that may contact a top surface of the TIM 140a and the circumference of the substrate 110. The heat dissipation plate 140b may be attached to the semiconductor chip 130 through the TIM 140a, and may be attached to the circumference of the top surface of the substrate 110 through the adhesive 160. Referring to FIG. 1D, the adhesive 160 may be located between the heat dissipation plate 140b, the coating layer 120, and the ground perimeter 116ab. Bottom surfaces of the barrier walls 152 may be on the same level as a bottom surface of the conductive adhesive 160 contacting the coating layer 120.

Examples of a method of forming the heat dissipation plate 140b may include injection molding. The heat dissipation plate 140b and the barrier walls 152 may include a metal material such as copper (Cu), aluminum (Al), or an alloy.

Since the ground line unit 116a is formed between the surface signal lines 112a through which different types of signals flow on the surface of the substrate 110 and the barrier walls 152 are formed to contact the ground line unit 116a, the semiconductor package 100a of the present embodiment may effectively shield interference between the different types of signals flowing through the surface signal lines 112a. Also, the barrier walls 152 and the heat dissipation plate 140b may be effectively grounded through the ground line unit 116a.

Also, the TIM 140a and the heat dissipation plate 140b may effectively discharge to the outside heat generated in the semiconductor chip 130.

Figure 2A:
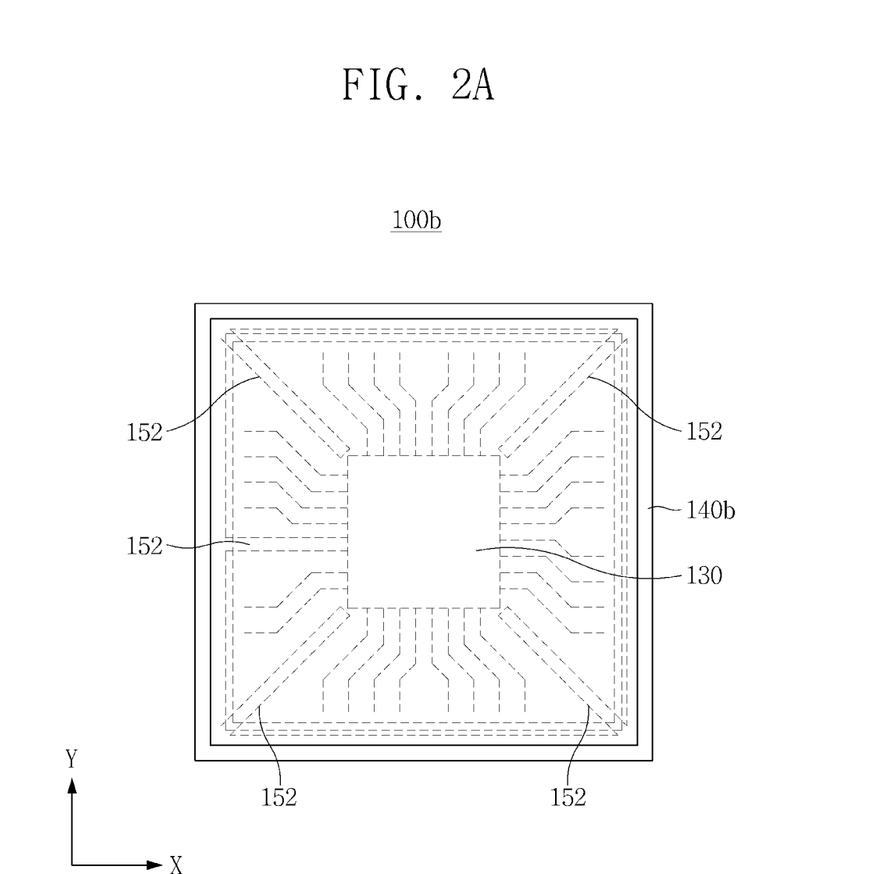
FIG. 2A is a top plan view illustrating a semiconductor package in accordance with another exemplary embodiment of the present general inventive concept.
Figure 2B:
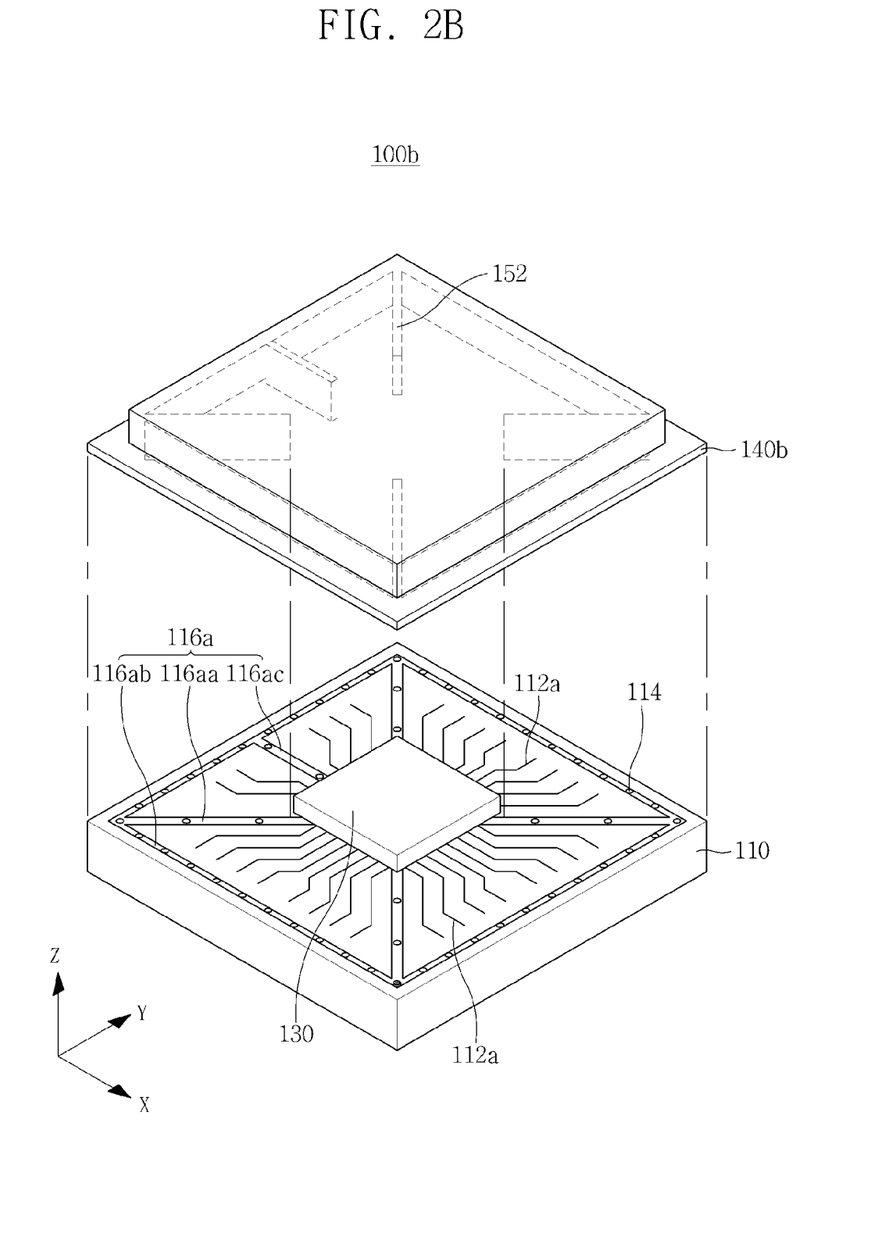
FIG. 2B is an exploded perspective view illustrating the semiconductor package of FIG. 2A.
Figure 2C:
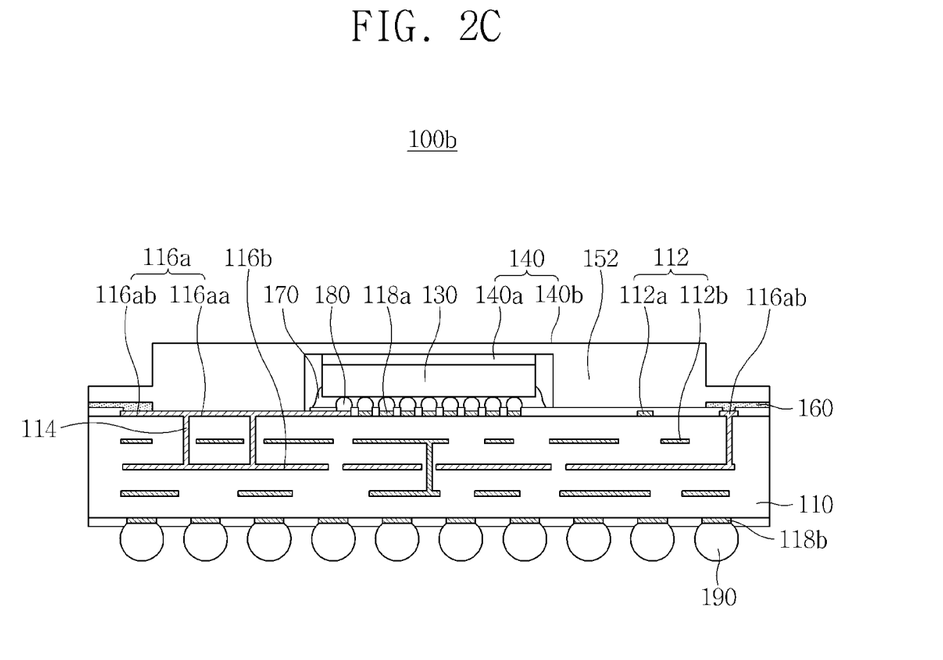
FIG. 2C is a side cross-sectional view taken in an X-axis direction of FIG. 2A.

FIG. 2A is a top plan view illustrating a semiconductor package 100b in accordance with another embodiment of the present general inventive concept. FIG. 2B is an exploded perspective view illustrating the semiconductor package 100b of FIG. 2A. FIG. 2C is a side cross-sectional view taken in an X-axis direction of FIG. 2A. An explanation of the same structures as those described with reference to FIG. 1D will be briefly given or omitted.

Referring to FIGS. 2A, 2B, 2C, 1C, and 1D, the semiconductor package 100b may include a substrate 110, a semiconductor chip 130, barrier walls 152, and a heat dissipation unit 140.

The semiconductor package 100b may further include chip bumps 180 that connect the semiconductor chip 130 and the substrate 110, solder balls 190 that are attached to the bottom surface of the substrate 110, underfill material 170 that is located under the semiconductor chip 130 and surrounds the chip bumps 180, and an adhesive 160 that is formed along a circumference of the top surface of the substrate 110.

The substrate 110 may include a signal line unit 112, via-holes 114, a ground line unit 116a, a ground plate 116b, upper lands 118a that contact the top surface of the substrate 110 and the chip bumps 180, and lower lands 118b that contact the bottom surface of the substrate 110 and the solder balls 190.

The signal line unit 112 may include surface signal lines 112a that are formed on the surface of the substrate 110, and internal signal lines 112b that are formed as multi-layers in the substrate 110.

The ground line unit 116a may include diagonal ground lines 116aa, vertical ground lines 116ac, and a ground perimeter 116ab that contacts the diagonal ground lines 116aa and the vertical ground lines 116ac. The vertical ground lines 116ac may be located such that different types of signal lines formed in the same direction are grouped into the same types of signal lines to be isolated from one another. Thus, the ground unit 116a may enclose individual groups of surface signal lines 112a transmitting the same types of signals. For example, the vertical ground lines 116ac may be located in a direction perpendicular to at least one side from among first through fourth sides of the substrate 110 in order to isolate another group of signal lines. Although only one vertical ground line 116ac is shown, this is only exemplary. Two or more vertical ground lines 116ac may be utilized to isolate additional groups of signal lines.

The diagonal ground lines 116aa and the vertical ground lines 116ac may be electrically connected to the ground plate 116b. At least one of the diagonal ground lines 116aa may be electrically connected to the upper lands 118a. Referring to FIG. 2C, the vertical ground lines 116ac may be electrically connected to the upper lands 118a.

The barrier walls 152 may be formed to contact the diagonal ground lines 116aa and the vertical ground lines 116ac. The same number of barrier walls 152 as diagonal ground lines 116aa and vertical ground lines 116ac may be formed, and on the same positions.

The heat dissipation unit 140 may include a TIM 140a and a heat dissipation plate 140b. The heat dissipation plate 140b may be integrally formed with the barrier walls 152.

Figure 3:
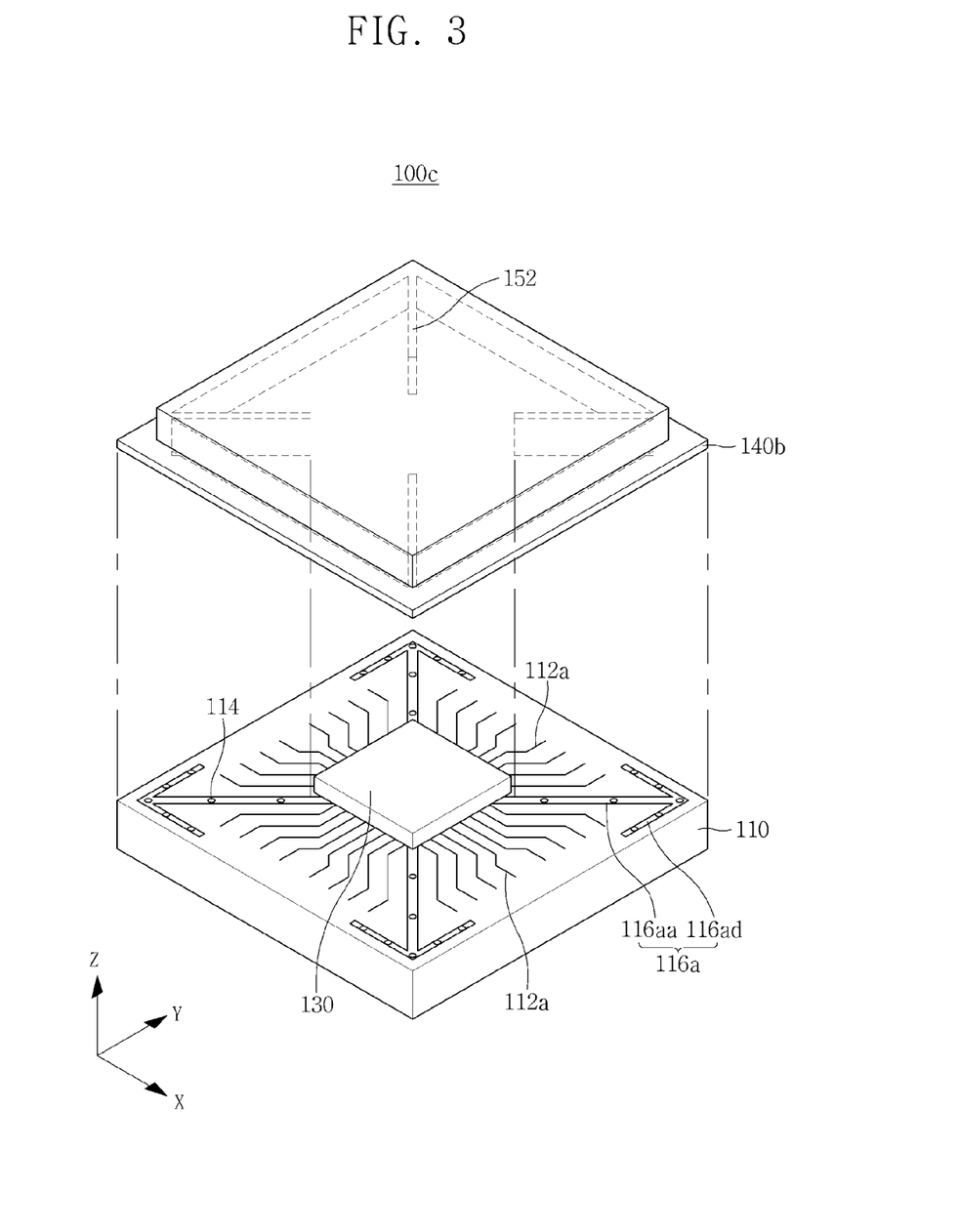
FIG. 3 is an exploded perspective view illustrating a semiconductor package in accordance with another exemplary embodiment of the present general inventive concept.

FIG. 3 is an exploded perspective view illustrating a semiconductor package 100c in accordance with another embodiment of the present general inventive concept. The following will be explained with further reference to FIGS. 1C and 1D, and an explanation of the same elements as those in FIGS. 1C and 1D will be briefly given or omitted.

Referring to FIGS. 3, 1C, and 1D, the semiconductor package 100c may include a substrate 110, a semiconductor chip 130, barrier walls 152, and a heat dissipation unit 140.

The semiconductor package 100c may further include chip bumps 180 that connect the semiconductor chip 130 and the substrate 110, solder balls 190 that are attached to the bottom surface of the substrate 110, an underfill material 170 that is located under the semiconductor chip 130 and surrounds the chip bumps 180, and an adhesive 160 that is formed along a circumference of the top surface of the substrate 110.

The substrate 110 may include a signal line unit 112, viaholes 114, a ground line unit 116a, a ground plate 116b, upper lands 118a that contact the top surface of the substrate 110 and the chip bumps 180, and lower lands 118b that contact the bottom surface of the substrate 110 and the solder balls 190.

The signal line unit 112 may include surface signal lines 112a that are formed on the surface of the substrate 110, and internal signal lines 112b that are formed as multi-layers in the substrate 110.

The ground line unit 116a may include diagonal ground lines 116aa and bent ground lines 116ad, each of which contacts an end of each of the diagonal ground lines 116aa and is bent therefrom. For example, the bent ground lines 116ad may be formed to have two members connected at an angle, each member positioned parallel to and spaced apart from one side of the substrate 110, and connected to the surface of the substrate 110. Thus, the ground unit 116a may partially enclose individual groups of surface signal lines 112a transmitting the same types of signals. The diagonal ground lines 116aa and the bent ground lines 116ad may be electrically connected to the ground plate 116b. At least one of the diagonal ground lines 116aa may contact with the upper lands 118a.

The barrier walls 152 may contact with the diagonal ground lines 116aa. The heat dissipation unit 140 may include a TIM 140a and a heat dissipation plate 140b. The same number of barrier walls 152 and diagonal ground lines 116aa may be formed on the same positions.

Figure 4:
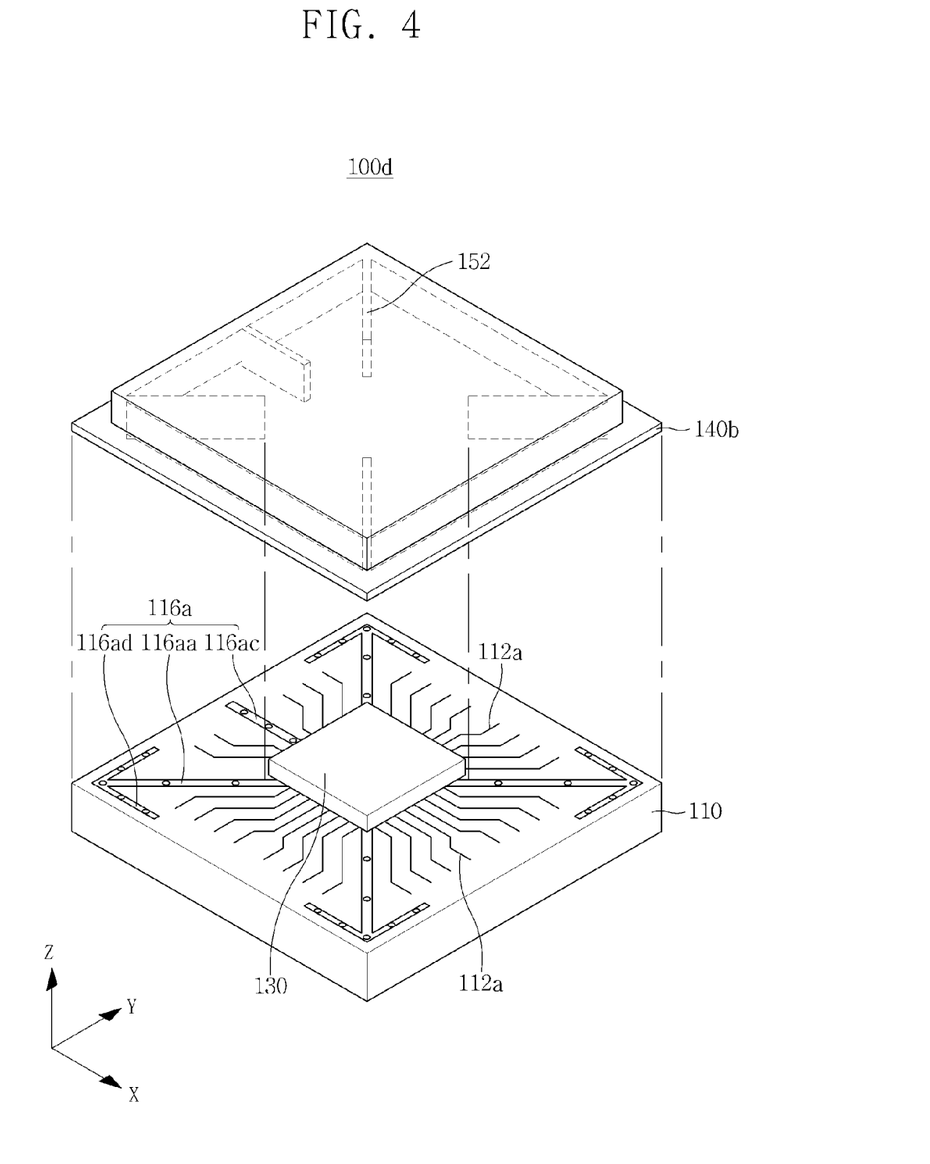
FIG. 4 is an exploded perspective view illustrating a semiconductor package in accordance with another exemplary embodiment of the present general inventive concept.

FIG. 4 is an exploded perspective view illustrating a semiconductor package 100d in accordance with another embodiment of the present general inventive concept. The following will be explained with further reference to FIGS. 1C, 1D, and 2C, and an explanation of the same elements as those in FIGS. 1C, 1D, and 2C will be briefly given or omitted.

Referring to FIGS. 4, 1C, and 1D, the semiconductor package 100d may include a substrate 110, a semiconductor chip 130, barrier walls 152, and a heat dissipation unit 140.

The semiconductor package 100d may further include chip bumps 180 that connect the semiconductor chip 130 and the substrate 110, solder balls 190 that are attached to the bottom surface of the substrate 110, an underfill material 170 that is located under the semiconductor chip 130 and surrounds the chip bumps 180, and an adhesive 160 that is formed along a circumference of the top surface of the substrate 110.

The substrate 110 may include a signal line unit 112, viaholes 114, a ground line unit 116a, a ground plate 116b, upper lands 118a that contact the top surface of the substrate 110 and the chip bumps 180, and lower lands 118b that contact the bottom surface of the substrate 110 and the solder balls 190.

The signal line unit 112 may include surface signal lines 112a that are formed on the surface of the substrate 110, and internal signal lines 112b that are formed as multi-layers in the substrate 110.

The ground line unit 116a may include diagonal ground lines 116aa, bent ground lines 116ad each of which contacts one end of each of the diagonal ground lines 116aa and is bent therefrom, and vertical ground lines 116ac. The diagonal ground lines 116aa, the bent ground lines 116ad, and the vertical ground lines 116ac may be electrically connected to the ground plate 116b.

At least one of the diagonal ground lines 116aa may be electrically connected to the upper lands 118a. Referring to FIG. 2C, the vertical ground lines 116ac may be electrically connected to the upper lands 118a.

The barrier walls 152 may be formed to contact the diagonal ground lines 116aa and the vertical ground lines 116ac. The same number of barrier walls 152 as diagonal ground lines 116aa and vertical ground lines 116ac may be formed, and on the same positions.

The heat dissipation unit 140 may include a TIM 140a and a heat dissipation plate 140b. The heat dissipation plate 140b may be integrally formed with the barrier walls 152.

Figure 5:
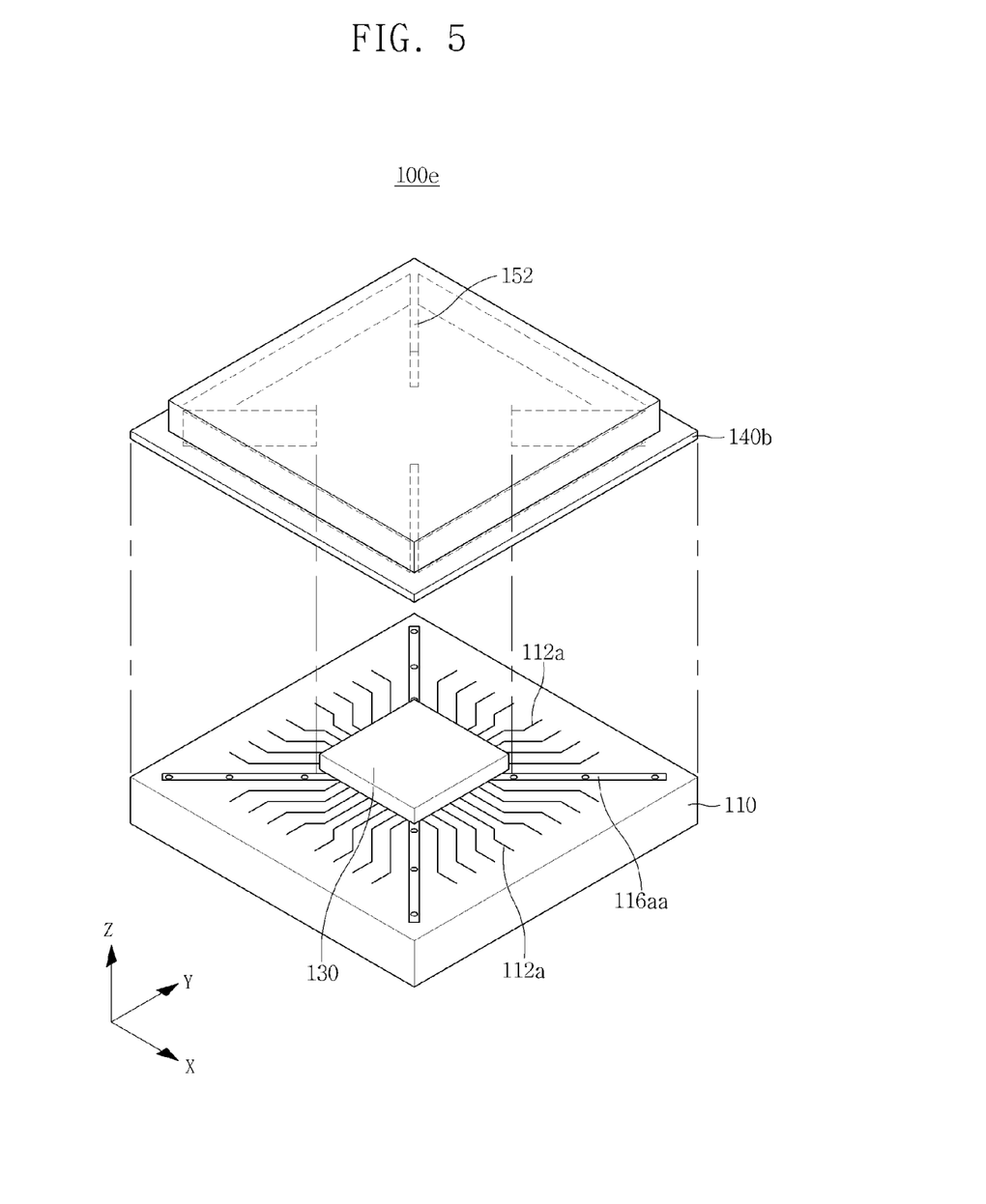
FIG. 5 is an exploded perspective view illustrating a semiconductor package in accordance with another exemplary embodiment of the present general inventive concept.

FIG. 5 is an exploded perspective view illustrating a semiconductor package 100e in accordance with another embodiment of the present general inventive concept. The following will be explained with further reference to FIGS. 1C and 1D, and an explanation of the same elements as those in FIGS. 1C and 1D will be briefly given or omitted.

Referring to FIGS. 5, 1C, and 1D, the semiconductor package 100e may include a substrate 110, a semiconductor chip 130, barrier walls 152, and a heat dissipation unit 140.

The semiconductor package 100e may further include chip bumps 180 that connect the semiconductor chip 130 and the substrate 110, solder balls 190 that are attached to the bottom surface of the substrate 110, an underfill material 170 that is located under the semiconductor chip 130 and surrounds the chip bumps 180, and an adhesive 160 that is formed along a circumference of the top surface of the substrate 110.

The substrate 110 may include a signal line unit 112, via-holes 114, a ground line unit 116a, a ground plate 116b, upper lands 118a that contact the top surface of the substrate 110 and the chip bumps 180, and lower lands 118b that contact the bottom surface of the substrate 110 and the solder balls 190.

The signal line unit 112 may include surface signal lines 112a that are formed on the surface of the substrate 110, and internal signal lines 112b that are formed as multi-layers in the substrate 110.

The ground line unit 116a may include diagonal ground lines 116aa that are formed on the surface of the substrate 110. The diagonal ground lines 116aa may be electrically connected to the ground plate 116b. At least one of the diagonal ground lines 116aa may be formed to contact the upper lands 118a.

The barrier walls 152 may be formed to contact the diagonal ground lines 116aa. The same number of barrier walls 152 and diagonal ground lines 116aa may be formed on the same positions.

The heat dissipation unit 140 may include a TIM 140a and a heat dissipation plate 140b. The heat dissipation plate 140b may be integrally formed with the barrier walls 152.

Figure 6:
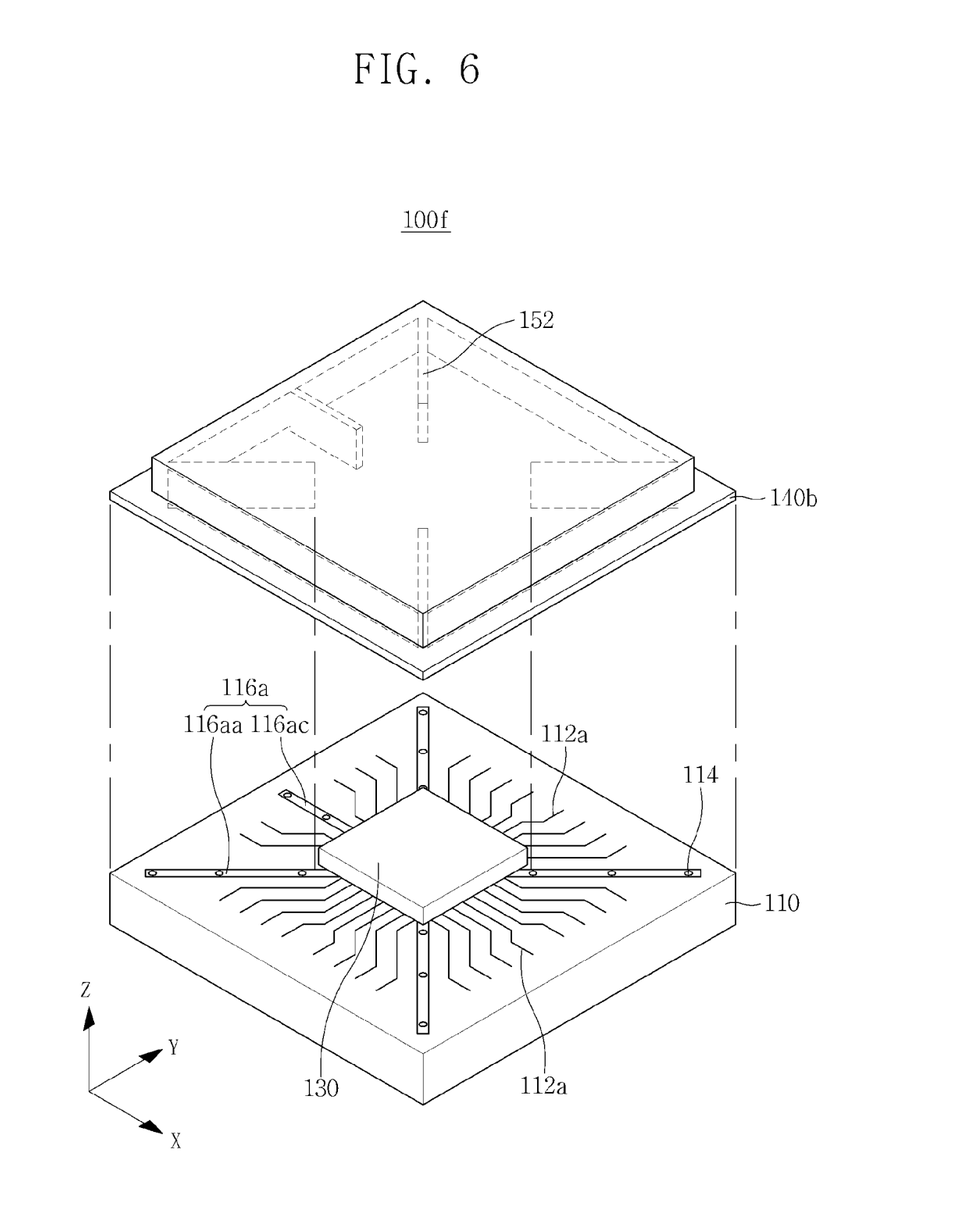
FIG. 6 is an exploded perspective view illustrating a semiconductor package in accordance with another exemplary embodiment of the present general inventive concept.

FIG. 6 is an exploded perspective view illustrating a semiconductor package 100f in accordance with another embodiment of the present general inventive concept. The following will be explained with further reference to FIGS. 1C, 1D, and 2C, and an explanation of the same elements as those in FIGS. 1C, 1D, and 2C will be briefly given or omitted.

Referring to FIGS. 6, 1C, and 1D, the semiconductor package 100f may include a substrate 110, a semiconductor chip 130, barrier walls 152, and a heat dissipation unit 140.

The semiconductor package 100d may further include chip bumps 180 that connect the semiconductor chip 130 and the substrate 110, solder balls 190 that are attached to the bottom surface of the substrate 110, an underfill material 170 that is located under the semiconductor chip 130 and surrounds the chip bumps 180, and an adhesive 160 that is formed along a circumference of the top surface of the substrate 110.

The substrate 110 may include a signal line unit 112, via-holes 114, a ground line unit 116a, a ground plate 116b, upper lands 118a that contact the top surface of the substrate 110 and the chip bumps 180, and lower lands 118b that contact the bottom surface of the substrate 110 and the solder balls 190.

The signal line unit 112 may include surface signal lines 112a that are formed on the surface of the substrate 110, and internal signal lines 112b that are formed as multi-layers in the substrate 110.

The ground line unit 116a may include diagonal ground lines 116aa and vertical ground lines 116ac. The diagonal ground lines 116aa and the vertical ground lines 116ac may be electrically connected to the ground plate 116b.

At least one of the diagonal ground lines 116aa may be electrically connected to the upper lands 118a. Referring to FIG. 2C, the vertical ground lines 116ac may be electrically connected to the upper lands 118a.

The barrier walls 152 may be formed to contact with the diagonal ground lines 116aa and the vertical ground lines 116ac. The same number of barrier walls 152 as diagonal ground lines 116aa and vertical ground lines 116ac may be formed, and on the same positions.

The heat dissipation unit 140 may include a TIM 140a and a heat dissipation plate 140b. The heat dissipation plate 140b may be integrally formed with the barrier walls 152.

Figure 7:
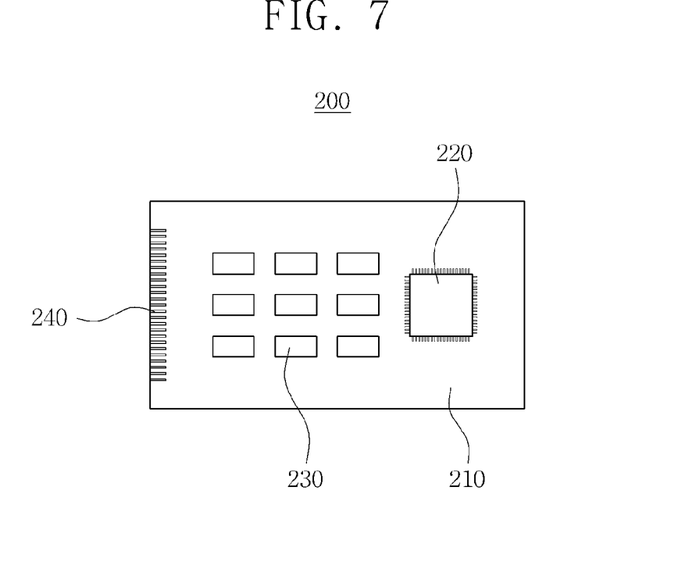
FIG. 7 is a conceptual view illustrating a semiconductor module including a semiconductor package, in accordance with an exemplary embodiment of the present general inventive concept.

FIG. 7 is a conceptual view illustrating a semiconductor module 200 including a semiconductor package, in accordance with an embodiment of the present general inventive concept. Referring to FIG. 7, the semiconductor module 200 may include a semiconductor device 230 disposed on a module substrate 210, and the semiconductor device 230 may include at least one of the semiconductor packages 100a, 100b, 100c, 100d, 100e, and 100f of FIGS. 1A through 6. The semiconductor module 200 may further include a microprocessor 220 mounted on the module substrate 210. Input/output terminals 240 may be disposed on at least one side of the module substrate 210. The semiconductor device 230 may be mounted on the module substrate 210 by using, for example, flip chip technology.

Figure 8:
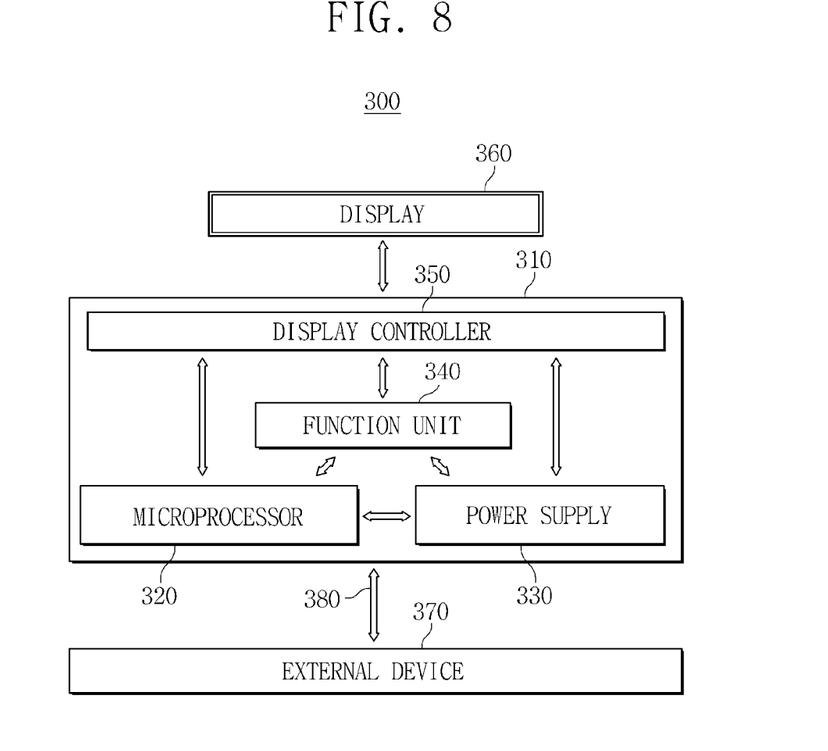
FIG. 8 is a conceptual block diagram illustrating an electronic system including a semiconductor package, in accordance with an exemplary embodiment of the present general inventive concept.

FIG. 8 is a conceptual block diagram illustrating an electronic system 300 including a semiconductor package, in accordance with an embodiment of the present general inventive concept. Referring to FIG. 8, at least one of the semiconductor packages 100a, 100b, 100c, 100d, 100e, and 100f of FIGS. 1A through 6 may be applied to the electronic system 300. The electronic system 300 may include a body 310, a microprocessor 320, a power supply 330, a functional unit 340, and/or a display controller 350. The body 310 may be a system board or a motherboard including a PCB. The microprocessor 320, the power supply 330, the functional unit 340, and the display controller 350 may be mounted on the body 310. The display unit 360 may be disposed on a top surface of the body 310 or outside the body 310. For example, a display unit 360 may be disposed on a surface of the body 310, and may display an image processed by the display controller 350. The power supply 330 may receive a predetermined voltage from an external power supply source, branch the predetermined voltage into voltages having various levels, and supply the voltages to the microprocessor 320, the functional unit 340, and the display controller 350. The microprocessor 320 may receive a voltage from the power supply 330 and control the functional unit 340 and the display unit 360. The functional unit 340 may perform various functions of the electronic system 300. For example, when the electronic system 300 is a mobile electronic product such as a cellular phone, the functional unit 340 may include various elements that may perform wireless communication functions such as a function of outputting an image to the display unit 360 and a function of outputting a voice to a speaker by communicating with an external apparatus 370 or by dialing. When the electronic system 300 includes a camera, the electronic system 300 may function as an image processor. In an application, when the electronic system 300 is connected to a memory card to expand capacity, the functional unit 340 may be a memory card controller. The functional unit 340 may transmit/receive signals to/from the external apparatus 370 through a wired or wireless communication unit 380. Also, when the electronic system 300 needs a USB to expand a function, the functional unit 340 may function as an interface controller. At least one of the semiconductor packages 100a, 100b, 100c, 100d, 100e, and 100f of FIGS. 1A through 6 may be included in at least one of the microprocessor 320 and the functional unit 340.

Figure 9:
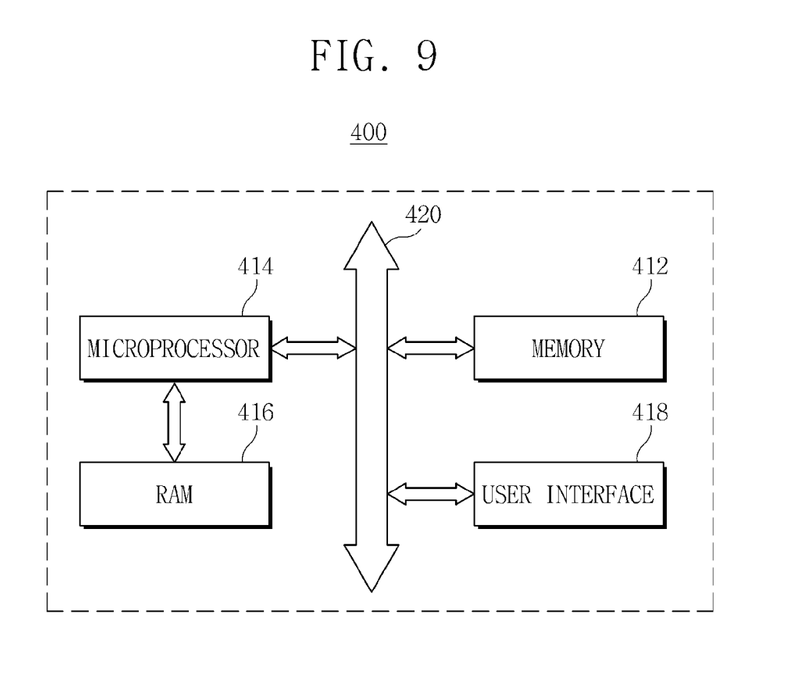
FIG. 9 is a block diagram illustrating an electronic system including a semiconductor package, in accordance with an exemplary embodiment of the present general inventive concept.

FIG. 9 is a block diagram illustrating an electronic system 400 including a semiconductor package, in accordance with another embodiment of the present general inventive concept. Referring to FIG. 9, the electronic system 400 may include at least one of the semiconductor packages 100a, 100b, 100c, 100d, 100e, and 100f of FIG. 1A through 6. The electronic system 400 may be included in a mobile device or a computer. For example, the electronic system 400 may include a memory system 412, a microprocessor 414, a random access memory (RAM) 416, and a user interface 418 that performs data communication via a bus 420. The microprocessor 414 may program and control the electronic system 400. The RAM 416 may be used as an operation memory of the microprocessor 414. For example, the microprocessor 414 or the RAM 416 may include a semiconductor device or the semiconductor package 100a, 100b, 100c, 100d, 100e, or 100f. The microprocessor 414, the RAM 416, and/or other elements may be assembled in a single package. The user interface 418 may be used to input data to the electronic system 400, or output data from the electronic system 400. Alternatively, user interface 418 may be substituted with any type of interface to communicate with an external device, for example, according to a wired or wireless communication method to transmit data from microprocessor 414 or RAM 416 to the external device or receive data from the external device. The memory system 412 may store codes for operating the microprocessor 414, data processed by the microprocessor 414, or external input data. The memory system 412 may include a controller and a memory.

Figure 10:
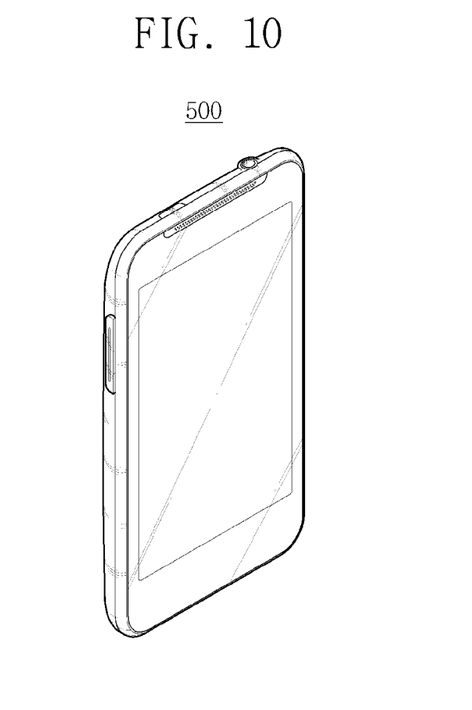
FIG. 10 is a perspective view illustrating a mobile wireless phone including a semiconductor package, in accordance with an exemplary embodiment of the present general inventive concept.

FIG. 10 is a perspective view illustrating a mobile wireless phone 500 in accordance with an embodiment of the present general inventive concept. The mobile wireless phone 500 may be used as a tablet PC. In addition, at least one of the semiconductor packages 100a, 100b, 100c, 100d, 100e, and 100f of FIGS. 1A through 6 may be used in a portable computer such as a notebook computer, an MPEG-1 audio player, an MP3 player, an MP4 player, a media player, a navigation device, a solid-state disc (SSD), a desktop computer, a vehicle, and a home appliance as well as a tablet PC.

As can be seen from the foregoing, a semiconductor package according to various embodiments of the present general inventive concept may prevent EMI from being generated in a semiconductor package, and effectively ground barrier walls by including the barrier walls that group signal lines to/from which different types of signals are input/output into signal lines to/from which the same types of signals are input/output to be isolated from one another, and a ground line that contacts the barrier walls.

The semiconductor package may discharge to the outside heat generated in the semiconductor package by including a heat dissipation unit including a TIM and a heat dissipation plate.

The semiconductor package may prevent a malfunction of a semiconductor device and further improve signal integrity of a system on which the semiconductor package is mounted by providing an EMI shielding function and a heat-discharging function.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor package comprising:
a substrate;
a semiconductor chip located on a top surface of the substrate;
signal lines formed on the top surface of the substrate and configured to allow different types of signals to input/output thereto/therefrom;
a ground line unit formed on the top surface of the substrate and configured to divide the signal lines into signal lines to/from which the same types of signals are input/output to be isolated from one another;
barrier walls configured to contact the ground line unit; and
a heat dissipation unit disposed on the semiconductor chip, wherein the ground line unit comprises diagonal ground lines located in diagonal directions of the substrate about the semiconductor chip, and
the heat dissipation unit comprises a thermal interface material (TIM) located on a top surface of the semiconductor chip, and a heat dissipation plate configured to cover the TIM and the substrate.

2. The semiconductor package of claim 1, wherein the ground line unit further comprises a ground perimeter formed along a circumference of the top surface of the substrate and configured to connect to one end of each of the diagonal ground lines, respectively.

3. The semiconductor package of claim 1, further comprising an adhesive formed along a circumference of the top surface of the substrate and configured to attach the substrate and the heat dissipation plate.

4. The semiconductor package of claim 1, wherein the barrier walls and the diagonal ground lines are equal in number and are formed on the same positions.

5. The semiconductor package of claim 4, wherein the heat dissipation plate is integrally formed with the barrier walls.

6. The semiconductor package of claim 5, wherein the heat dissipation plate comprises copper, aluminum, or a metal alloy.

7. The semiconductor package of claim 1, wherein the TIM comprise thermal grease, a thermal sheet/film, a thermal PAD, and a thermal adhesive.

8. The semiconductor package of claim 1, further comprising upper lands and chip bumps stacked between the substrate and the semiconductor chip,
wherein at least one of the diagonal ground lines is electrically connected to the upper lands.

9. The semiconductor package of claim 1, further comprising a ground plate formed in the substrate to have a plate shape and configured to be electrically connected to the ground line unit.

10. The semiconductor package of claim 1, wherein the ground line unit further comprises vertical ground lines formed to be perpendicular to at least one side of the substrate.

11. The semiconductor package of claim 10, further comprising a ground perimeter formed along a circumference of the top surface of the substrate and configured to be connected to respective one ends of each of the diagonal ground lines and the vertical ground lines.

12. The semiconductor package of claim 10, wherein the barrier walls are equal in number to and formed on the same positions as the diagonal ground lines and the vertical ground lines.

13. A semiconductor package comprising:
a substrate;
a semiconductor chip located on a top surface of the substrate;
signal lines formed on the top surface of the substrate and configured to allow different types of signals to be input/output thereto/therefrom;
a ground line unit formed on the top surface of the substrate and configured to divide the signal lines into signal lines to/from which the same types of signals are input/output to be isolated from one another;
barrier walls configured to contact the ground line unit; and
a heat dissipation unit disposed on the semiconductor chip,
wherein the ground line unit comprises diagonal ground lines located in diagonal directions of the substrate about the semiconductor chip, bent ground lines bent from one ends of the diagonal ground lines, and vertical ground lines located to be perpendicular to at least one side of the substrate, and the heat dissipation unit comprises a thermal interface material (TIM) located on a top surface of the semiconductor chip, and a heat dissipation plate configured to cover the TIM and the substrate.

14. The semiconductor package of claim 13, wherein the bent ground lines are formed to have two members connected at an angle, each member positioned parallel to and spaced apart from one side of the substrate, and connected to the top surface of the substrate.

15. The semiconductor package of claim 13, further comprising upper lands and chip bumps stacked between the substrate and the semiconductor chip, wherein the vertical ground lines are electrically connected to the upper lands.

16. An electronic system, comprising a power supply configured to supply power to components of the electronic system; and a microprocessor including a semiconductor package to receive the power, comprising:

a substrate, a semiconductor chip mounted on the substrate, signal lines formed on a surface of the substrate and configured to transmit different types of signals, respectively, a ground line unit formed to isolate the signal lines into groups of lines through which same types of signals are transmitted;

barrier walls formed in contact with the ground line unit between the groups of lines; and a heat dissipation unit formed in contact with the semiconductor chip.

17. The electronic system of claim 16, further comprising an interface to communicate with an external device according to a wired or wireless communication method to transmit data of the semiconductor chip to the external device or receive data from the external device.

18. The electronic system of claim 16, wherein the ground line unit is formed to partially enclose each of the groups of lines, individually.

19. The electronic system of claim 16, wherein the ground line unit is formed to completely enclose each of the groups of lines, individually.

20. The electronic system of claim 16, wherein the heat dissipation unit comprises:

a heat dissipation plate attached to the substrate and covering the semiconductor chip; and a TIM formed between the heat dissipation plate and the semiconductor chip to attach the heat dissipation plate to the semiconductor chip.

* * * * *